(12) United States Patent
Ni et al.

(10) Patent No.: US 11,309,165 B2
(45) Date of Patent: Apr. 19, 2022

(54) GAS SHOWERHEAD, MANUFACTURING METHOD, AND PLASMA APPARATUS INCLUDING THE GAS SHOWERHEAD

(71) Applicant: ADVANCED MICRO-FABRICATION EQUIPMENT INC. CHINA, Shanghai (CN)

(72) Inventors: Tuqiang Ni, Shanghai (CN); Zhaoyang Xu, Shanghai (CN); Jiawei Jiang, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 0 days.

(21) Appl. No.: 16/839,502

(22) Filed: Apr. 3, 2020

(65) Prior Publication Data
US 2020/0321193 A1    Oct. 8, 2020

(30) Foreign Application Priority Data

Apr. 4, 2019   (CN) .......................... 201910269600.0

(51) Int. Cl.
*H01J 37/32*     (2006.01)
*H01L 21/67*     (2006.01)

(52) U.S. Cl.
CPC .... *H01J 37/3244* (2013.01); *H01J 37/32137* (2013.01); *H01L 21/67069* (2013.01); *H01J 2237/002* (2013.01); *H01J 2237/3347* (2013.01)

(58) Field of Classification Search
CPC ............ H01J 37/32137; H01J 37/3244; H01J 2237/002; H01J 2237/3347; H01L 21/67069
See application file for complete search history.

(56) References Cited

U.S. PATENT DOCUMENTS

| | | | | |
|---|---|---|---|---|
| 2009/0081876 A1* | 3/2009 | Bera | ................ | H01L 21/31116 438/712 |
| 2009/0178614 A1* | 7/2009 | Kasai | ................ | H01J 37/3244 118/708 |

(Continued)

*Primary Examiner* — Yuechuan Yu
(74) *Attorney, Agent, or Firm* — Womble Bond Dickinson (US) LLP; Joseph Bach, Esq.

(57) ABSTRACT

Disclosed are a gas showerhead, a method of manufacturing the same, and a plasma apparatus provided with the gas showerhead. The gas showerhead comprises a back plate and a gas distribution plate, the gas distribution plate including a plurality of annular gas distribution regions with the center of the gas distribution plate as their center; on each annular gas distribution region are provided a plurality of gas through-holes penetrating through the gas inlet face and the gas outlet face, the gas through-holes at least including a plurality of first gas through-holes inclined at a certain angle, and the gas through-holes further include a plurality of second gas through-holes, the second gas through-holes being parallel to the central axis or having a radial inclination direction different from the first gas through-holes; and in the same annular gas distribution region, gas flowing out of the first gas through-holes and gas flowing out of the second gas through-holes are kept away from each other.

30 Claims, 12 Drawing Sheets

(56) References Cited

U.S. PATENT DOCUMENTS

| | | | |
|---|---|---|---|
| 2011/0162800 A1* | 7/2011 | Noorbakhsh | H01J 37/32091 156/345.34 |
| 2015/0176126 A1* | 6/2015 | Ge | C23C 16/45574 137/240 |

\* cited by examiner

GAS SHOWERHEAD, MANUFACTURING METHOD, AND PLASMA APPARATUS INCLUDING THE GAS SHOWERHEAD

RELATED APPLICATION

The present application claims priority to and the benefit of Chinese Patent Application No. 201910269600.0, filed on Apr. 4, 2019, and the disclosure of which is hereby incorporated by reference in its entirety.

FIELD

Embodiments of the present disclosure relate to semiconductor fabrication, and more particularly relate to a gas showerhead for a plasma apparatus, a method of manufacturing the gas showerhead, and a plasma apparatus provided with the gas showerhead.

BACKGROUND

A semiconductor chip manufacturing process requires a considerable amount of micro-processing. Typical plasma etching reactors may form various kinds of through-holes or grooves in micro or nanometer scale on a substrate; in further combination with other processes such as CVD (Chemical Vapor Deposition), various kinds of semiconductor chip products are finally fabricated.

With the advance of technologies, ultra-high aspect ratio etching gains more and more applications and demands. For example, in the field of memories, 3D NAND flash memory has become one of main memory chip structures. The process of fabricating a 3D NAND chip comprises: first, alternately forming silicon oxide layers and silicon nitride layers, wherein the number of layers may reach 64 or even over 100; then, performing plasma etching through all of these material layers. As the overall thickness of these material layers is very large, generally 5 µm or even higher, such etching is referred to as ultra-high aspect ratio etching.

When the number of silicon oxide and silicon nitride layers to be etched exceeds 100, it is hard for conventional technologies to guarantee a vertical deep holes or grooves, wherein sidewall inclination would occur, and inclination directions of different areas on the substrate are not exactly consistent.

Therefore, to obtain vertically etched holes or grooves, it is desirable to find the causes of sidewall inclination and make improvements thereto.

SUMMARY

To overcome the problems mentioned above, the present disclosure provides a gas showerhead for a plasma apparatus so as to improve uniformity.

A gas showerhead for a plasma apparatus is provided, the gas showerhead comprising: a gas distribution plate being a disc-shaped structure with a center, the gas distribution plate including a gas inlet face, a gas outlet face, and a central axis passing through the center and perpendicular to the gas distribution plate, wherein the gas distribution plate comprises a plurality of annular gas distribution regions with the center of the gas distribution plate;

each annular gas distribution region is provided with a plurality of gas through-holes penetrating through the gas inlet face and the gas outlet face, the gas through-holes at least including a plurality of first gas through-holes radially inclined at a certain angle, and a plurality of second gas through-holes being parallel to the central axis or having a radial inclination direction different from the first gas through-holes; and in the same annular gas distribution region, gas flowing out of the first gas through-holes and gas flowing out of the second gas through-holes are kept away from each other.

Optionally, a first gas outlet direction of the plurality of first gas through-holes is inclined towards a direction of the central axis, and a second gas outlet direction of the plurality of second gas through-holes is inclined away from the direction of central axis or is parallel to the direction of the central axis.

Optionally, a first gas outlet direction of the plurality of first gas through-holes is inclined away from the direction the central axis, and a second gas outlet direction of the plurality of second gas through-holes is inclined towards the direction of the central axis or is parallel to the direction of the central axis.

Optionally, in a same annular gas distribution region, there exists a first radial distance difference between a first radial distance from the opening center of the respective first gas through-hole in the gas inlet face to the central axis and a second radial distance from the opening center of the respective second gas through-hole in the gas inlet face to the central axis; and in the same gas distribution region, there exists a second radial distance difference between a third radial distance from the opening center of the respective first gas through-hole in the gas outlet face to the central axis and a fourth radial distance from the opening center of the respective second gas through-hole in the gas outlet face to the central axis; wherein the second radial distance difference is greater than the first radial distance difference.

Optionally, in a same gas distribution region, a first radial distance from the opening center of the respective first gas through-hole in the gas inlet face to the central axis is identical to a second distance from the opening center of the respective second gas through-hole in the gas inlet face to the central axis, the first gas through-holes and the second gas through-holes being arranged alternately with intervals.

Optionally, in a same gas distribution region, a first radial distance from the opening center of the respective first gas through-hole in the gas inlet face to the central axis is identical to a second radial distance from the opening center of the respective second gas through-hole in the gas inlet face to the central axis, wherein a plurality of neighboring first gas through-holes form a first gas unit, and a plurality of neighboring second gas through-holes form a second gas unit, the first gas unit and the second gas unit being arranged alternately with intervals.

Optionally, a first gas outlet direction of the plurality of first gas through-holes is inclined towards a direction of the central axis, and a second gas outlet direction of the plurality of second gas through-holes is inclined away from the direction of the central axis; on the gas distribution plate are further provided a plurality of third gas through-holes, the third gas through-holes being parallel to the central axis, wherein the first gas through-holes, the second gas through-holes, and the third gas through-holes are arranged alternately with intervals.

Optionally, in a same gas distribution region, a radial distance difference between the first radial distance from the opening center of the respective first gas through-hole in the gas inlet face to the central axis and the second radial distance from the opening center of the respective second gas-through hole on the gas inlet face to the central axis is greater than 0.

Optionally, in a same gas distribution region, the first radial distance from the opening center of the respective first gas through-hole in the gas inlet face to the central axis is shorter than the second radial distance from the opening center of the second gas through-hole in the gas inlet face to the central axis, wherein the opening centers of the first gas through-holes in the gas inlet face and the opening centers of the second gas through-holes in the gas inlet face are disposed pairwise in a same radial direction.

Optionally, in a same gas distribution region, the first radial distance from the opening center of the respective first gas through-hole in the gas inlet face to the central axis is shorter than the second radial distance from the opening center of the second gas through-hole in the gas inlet face to the central axis, wherein the opening centers of the first gas through-holes and the opening centers of the second gas through-holes are respectively disposed in different radial directions.

Optionally, the first inclination angle and the second inclination angle are greater than or equal to 0° but lower than 30°.

Optionally, the included angle between the first gas through holes and the second gas through-holes is greater than or equal to 5°.

Optionally, an annular isolation region is arranged between two neighboring annular gas distribution regions, wherein the annular gas distribution regions and the annular isolation regions are distributed sequentially and alternately along the radial direction.

Optionally, the radial width of the annular isolation region is greater than the radial width of the gas distribution region.

Optionally, the gas showerhead further comprises a back plate, the back plate being disposed opposite to the gas distribution plate, wherein a plurality of thermal conduction layers are provided between the back plate and the gas distribution plate.

Optionally, the thermal conduction layers are disposed on the upper surface of the annular isolation region.

Optionally, openings of at least part of the first gas through-holes or second gas through-holes in the gas outlet face are located in respective orthographic projection regions of the thermal conduction layers on the gas outlet face of the gas distribution plate.

Optionally, the gas inlet face includes a plurality of recessed grooves, each of the recessed groove having an inclined bottom face, the first gas through-holes being disposed on the inclined bottom face of respective recessed grooves.

Optionally, the recessed groove includes a sidewall recessed along the gas inlet face towards the gas outlet face and an inclined bottom face having a certain angle relative to the sidewall.

Optionally, the recessed groove includes two inclined bottom faces inclined along different directions, the two inclined bottom faces forming a "V"-shaped recessed groove.

Optionally, the first gas through-holes and the second gas through-holes extend perpendicular to the inclined bottom face of respective recessed grooves towards the gas outlet face.

Optionally, a plurality of sink holes are provided in the recessed grooves, the sink holes being arranged in the inclined bottom face of respective recessed grooves, and the openings of respective gas through-holes are arranged in the inclined bottom face of respective sink holes.

Optionally, a plurality of sink holes are provided in the gas inlet face, each of the sink holes having an inclined bottom face, and the openings of the gas through-holes are arranged in the inclined bottom face of respective sink holes.

The present disclosure further provides a plasma apparatus, comprising a vacuum reaction chamber, wherein in the vacuum reaction chamber are provided:

a base configured for supporting a to-be-processed substrate;

a gas showerhead disposed opposite to the base, configured for supplying a reactant gas into the vacuum reaction chamber;

a radio frequency source power source configured for deionizing the reactant gas to generate plasma;

a radio frequency bias power which is applied to the base to drive charged particles in the plasma to process the substrate; wherein the gas showerhead comprises the features mentioned above.

Optionally, the radio frequency bias power output a power which is greater than or equal to 10 kilowatts.

Optionally, the aspect ratio for etching the substrate is equal to 40:1.

Optionally, the number of target layers for etching the substrate is greater than 100.

Optionally, an output frequency of the radio frequency bias power e is greater than or equal to 100 Khz but lower than or equal to 2 Mhz.

Optionally, the radio frequency bias power outputs a pulse radio frequency bias signal.

Optionally, the gas pressure within the reaction chamber is lower than or equal to 100 mTorr.

The present disclosure further provides a method of manufacturing the gas showerhead mentioned above, comprising steps of:

providing a gas distribution plate of a disc shape, the gas distribution plate including a gas inlet face, a gas outlet face, and a central axis perpendicular to the gas distribution plate;

arranging a plurality of annular gas distribution regions on the gas distribution plate, and arranging, in each of the gas distribution regions, a plurality of first gas through-holes with a first inclination angle and a plurality of second gas through-holes with a second inclination angle, wherein a first gas outlet direction of the plurality of first gas through-holes is arranged to incline towards a direction of the central axis, and a second gas outlet direction of the plurality of second gas through-holes is arranged to incline away from the direction of the central axis.

Optionally, a plurality of annular recessed grooves are made in the gas inlet face of the gas distribution plate, each of the annular recessed grooves having at least one inclined bottom face;

the included angle between the inclined bottom face and the gas inlet face is 0°~30°, and the first gas through-holes and the second gas through-holes are arranged perpendicular to respective inclined bottom faces.

Optionally, when making the recessed groove, a recessed portion with certain depth is first made perpendicular to the gas inlet face towards the gas outlet face, and then the inclined bottom face is made at the bottom of the recessed portion.

Optionally, a plurality of sink holes are provided in the inclined bottom face, and gas inlets of the gas through-holes are arranged at the bottom of respective sink holes.

Optionally, the diameter of the sink hole is greater than the diameter of the gas through-hole.

DETAILED DESCRIPTION OF EMBODIMENTS

Hereinafter, preferred embodiments of the present disclosure will be described in further detail with reference to the accompanying drawings.

Figure 1:
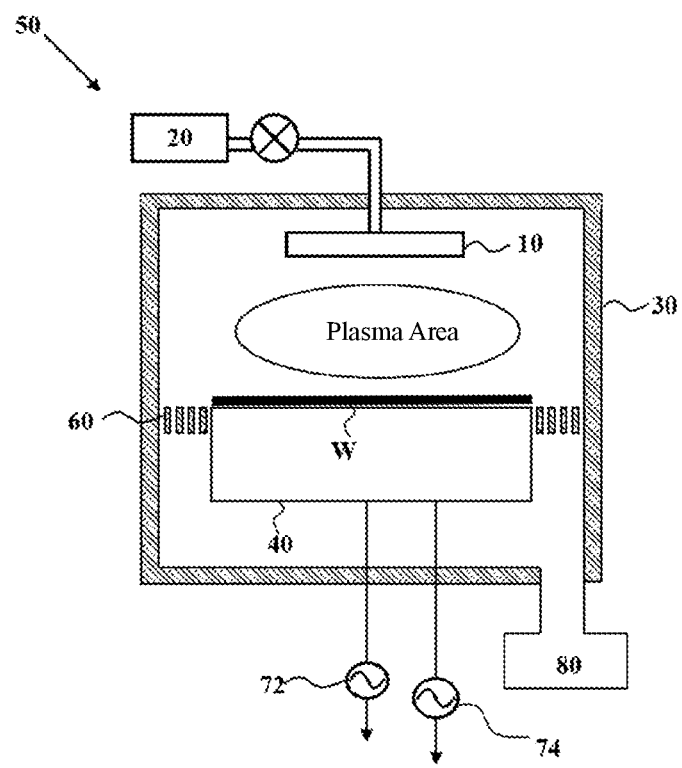
FIG. 1 is a structural schematic diagram of a plasma apparatus according to the present disclosure.

The present disclosure provides a plasma apparatus for ultra-high aspect ratio etching, as shown in FIG. 1, comprising a vacuum reaction chamber 50 enclosed by a reaction chamber outer wall 30, a reaction space being formed inside the vacuum reaction chamber to perform plasma etching; and a base 40 provided in the vacuum reaction chamber, for holding a to-be-processed substrate W, the base 40 also serving as a lower electrode of the vacuum reaction chamber. A flat gas showerhead 10 is disposed at the top of the reaction chamber, the gas showerhead 10 communicating with an external gas source 20 via a pipeline. The gas showerhead is disposed at a position opposite to the base and also serves as an upper electrode of the vacuum reaction chamber. A radio frequency source power 72 may be selectively applied to the upper electrode or the lower electrode so as to generate a high-frequency electric field between the upper electrode and the lower electrode, such that a reactant gas introduced in the reaction chamber is ionized to generate plasma. A radio frequency bias power 74 is applied to the lower electrode, such that enough direct current bias voltage is generated in a surface sheath on the substrate to accelerate the charged ions in the plasma to bombard the substrate rapidly for etching. A plasma confinement component 60 is provided surrounding the base 40 to confine the plasma within a plasma area; a vacuum-generation device 80 is configured to evacuate unreacted gases and reaction byproduct gases in the reaction chamber so as to maintain a vacuum state in the reaction chamber 50.

Figure 2:
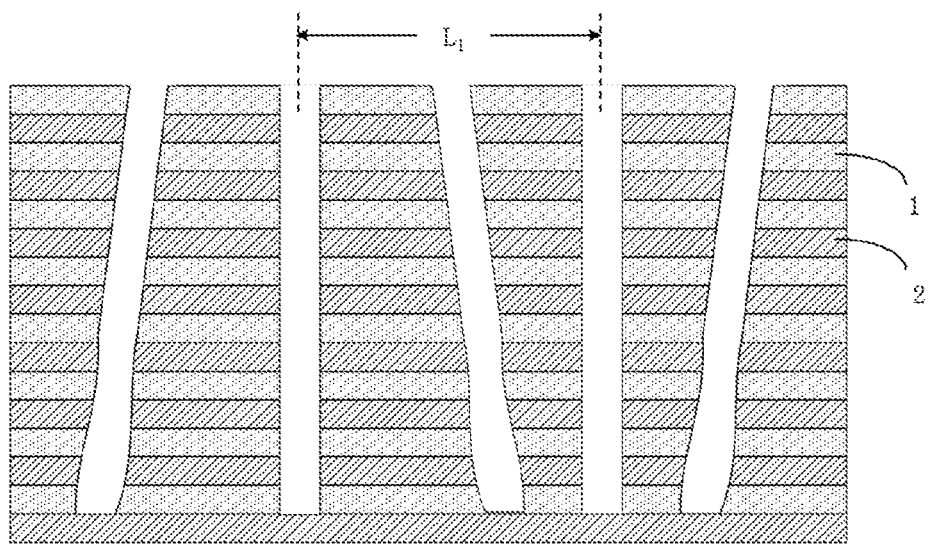
FIG. 2 is a morphological diagram of a result of substrate etching according to prior art.

For the sake of processing, in the present disclosure, the substrate W processed in the reaction chamber includes a plurality of dielectric layers. The substrate W is typically a 3D NAND substrate, including first dielectric layers 1 and second dielectric layers 2, the first dielectric layers 1 and the second dielectric layers 2 being stacked alternately, as shown in FIG. 2. The first dielectric layer 1 is made of silicon oxide, and the second dielectric layer is made of silicon nitride. The cumulative number of layers of the silicon oxide layers and the silicon nitride layers is greater than or equal to 100. The aspect ratio of a through-hole etched on the dielectric layers is greater than or equal to 40.

During the etching process, it is found that with the constant increase of the etching depth, verticality of the sidewall of the etched deep hole cannot be guaranteed. Test results show that the etched deep holes or grooves are often inclined or distorted, and the inclination directions and inclination angles in different areas are not exactly uniform. FIG. 2 is a schematic diagram of an etching result obtained from a conventional technique. It may be seen from FIG. 2 that some holes or grooves on the etched substrate are distorted, while some other holes or grooves meet the requirements of a good etched morphology standard; besides, a mirror image phenomenon sometimes occurs to the inclination angles and distortion directions of etched holes or grooves on both sides of the well-etched holes or grooves. Meanwhile, the inventors find that the spacing L1 between neighboring well-etched holes or grooves is consistent with the spacing L1 between neighboring two gas outlets in the gas showerhead; therefore, it was speculated that distribution of gas through-holes in the gas showerhead in the reaction chamber has a significant impact on etching uniformity of the substrate.

Figure 3:
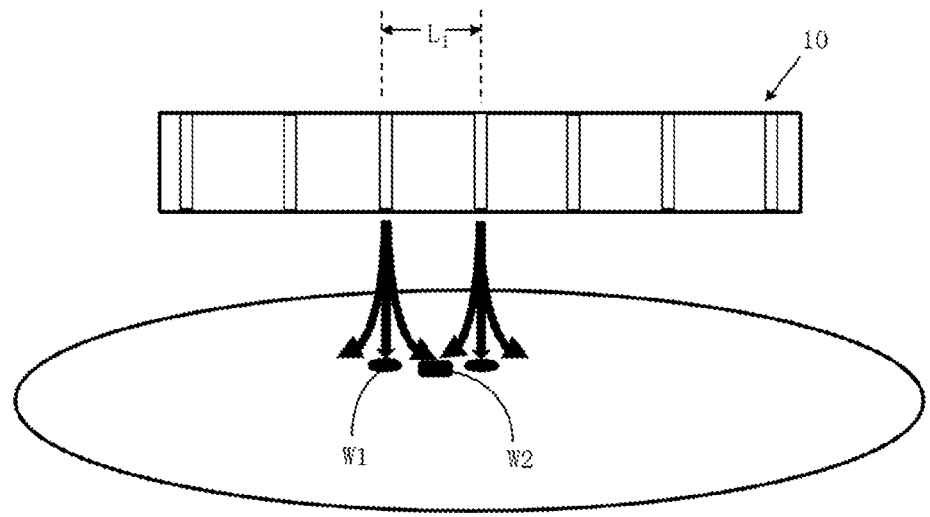
FIG. 3 is a schematic diagram of the inter-hole spacing of the gas showerhead acting on the substrate surface.

To verify the speculation, the inventors has made the test shown in FIG. 3, wherein a test substrate W is placed in the plasma reaction chamber; a certain amount of precipitation gas is introduced into the gas showerhead; after a period of time, it is found that the thin film thickness deposited in the corresponding area W1 under the gas through-holes in the gas showerhead is smaller than that of the area W2 corresponding to the area between neighboring gas through-holes; thus, it may be confirmed that distribution of the gas through-holes in the gas showerhead has a significant impact on etching uniformity of the substrate.

An objective of the plasma reactor according to the present disclosure is to etch a hole or groove with an ultra-high aspect ratio. In order to achieve an etching result with a good morphology, the reactant gas includes not only an etching gas, but also a precipitation gas; particularly, during the process of high aspect ratio etching, etching of holes or grooves is a process in which etching and depositing are concurrently carried out. The inventors find through studies that irrespective of the etching process or depositing process, the un-ionized gas in the reactant gas substantially does not participate in the reaction, and only the neutral free radicals or charged particles in the plasma can carry out the etching or depositing reaction. Therefore, when the reactant gas flows out of the gas showerhead 10 at a certain speed, a part of the gas is vertically sprayed to the substrate surface to form a molecular flow; another part of the gas is diffused around to flow towards the surface of the substrate at a lower speed to form a transitional molecular flow; because the transitional molecular flow has a relatively long gas diffusion path and experiences a long time in the plasma de-ionization area, there are more deionized free radicals and charged particles that may participate in the etching reaction and the depositing reaction, while the molecular gas is vertically sprayed to the substrate surface such that fewer free radicals and charged particles are generated from deionization; as such, compared with other areas W2, less compositions on the substrate surface area W1 to which the molecular flow is sprayed participate in the etching reaction or depositing reaction, which would cause an uneven processing on the substrate surface; when the mask layer processing on the substrate surface is uneven, the etched deep holes or grooves would be distorted and inclined during the process of transporting the etched pattern downward.

Figure 4:
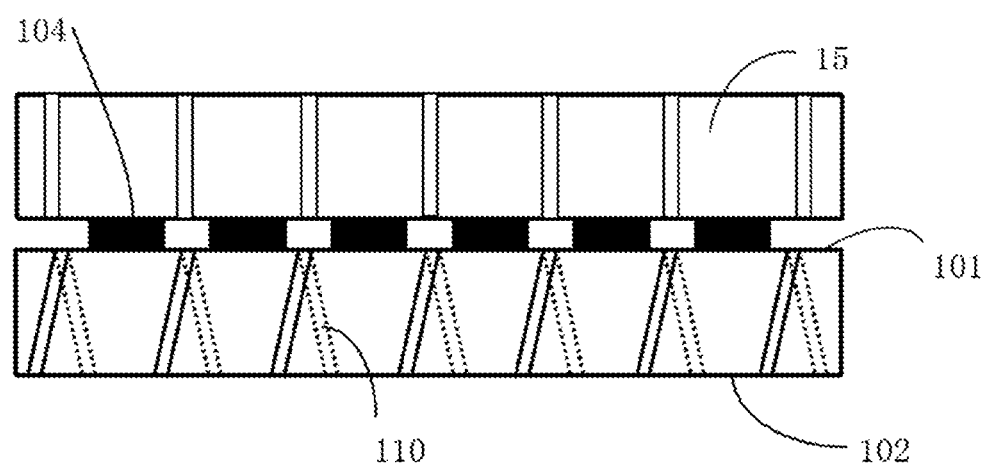
FIG. 4 is a local structural schematic diagram of the gas showerhead according to the present disclosure.

To solve the technical problem above, the present disclosure provides a gas showerhead. As shown in FIG. 4, the gas showerhead comprises a back plate 15 and a gas distribution plate 100. A plurality of gas through-holes are arranged in the gas distribution plate so as to convey the reactant gas between the upper and lower electrodes. Because the gas distribution plate of the gas showerhead contacts the plasma during the etching process, in order to guarantee a uniform plasma processing with respect to the substrate, it needs to maintain a uniform temperature across different areas of the gas distribution plate. The material for the back plate in the present disclosure is usually aluminum; and the material for the gas distribution plate is usually a ceramic material resistant against plasma corrosion. In some techniques, plasma bombardment against the gas distribution plate would cause an over high and uneven temperature on the gas distribution plate and potentially cause cracks on the gas distribution plate; moreover, as the reacting process advances, the gradually heated gas distribution plate will cause processing discrepancies across different batches of substrates and reduce the repeatability of the equipment; therefore, it is needed to cool the gas distribution plate. In some other techniques, sometimes it needs to uniformly heat the gas distribution plate. Because gas through-holes are extensively distributed in the gas distribution plate and there is no space for arranging a temperature adjustment device, the present disclosure arranges the temperature adjustment device inside the back plate 15. The temperature adjustment device includes a heating unit and a cooling unit, which are not detailed here. To implement temperature control of the gas distribution plate and meanwhile to avoid poor contact caused by different thermal expansion coefficients of the different materials used respectively for the substrate and the gas distribution plate, the present disclosure provides a thermal conduction layer 104 between the back plate 15 and the gas distribution plate 100; the thermal conduction layer 104 may guarantee a good thermal contact between the gas distribution plate and the back plate; by controlling the temperature adjustment device in the back plate to control the temperature of the gas distribution plate, the temperature uniformity of the entire gas distribution plate is improved, such that the gas distribution plate can have a good uniformity and repeatability when processing different areas of the same substrate or different batches of substrates.

In the case that the number of gas through-holes is limited, in order to guarantee the etching rate of the substrate, enough reactant gas needs to be supplied to the vacuum reaction chamber; therefore, a certain flow rate is required for the reactant gas through each gas through-hole. To avoid the nonuniform processing phenomenon generated on the substrate surface, after excluding the impact of the electric field distribution in the reaction chamber, the inventors find that the flow rate and the diffusion degree of the gas flowing out of the gas distribution plate are main causes for inclination of etched deep holes. Although reduction of the flow rate of the reactant gas flowing out of the gas through-holes is helpful to solve the distortion and inclination issues of the etched deep holes, it would also cause reduction of the total amount of the reactant gas supplied into the vacuum reaction chamber and further cause reduction of the etching rate for the substrate, such that the production demands cannot be satisfied. Increase of the amount of gas through-holes can only be achieved by increasing the amount of gas through-holes between two neighboring gas through-holes, because the gas through-holes are distributed annularly in the gas distribution plate, a relatively large size of thermal conduction layer is arranged between neighboring annular gas through-holes, and the spacing between two thermal conduction layers is relatively small. However, when the amount of gas through-holes increases, the gas outlets in the gas outlet face of the gas distribution plate will become denser, such that when the reactant gas flows downwards to the substrate surface, the small spacing between the outlets of two neighboring gas through-holes would cause the gas at the outlets to be mixed into one gas flow, creating a gas curtain phenomenon. The annular gas curtain will cause an even worse impact on the processing uniformity of the substrate; therefore, the present disclosure needs to provide a gas showerhead which can uniformly process the substrate.

As shown in FIG. 4, a plurality of gas channels are provided in the back plate 15, wherein the reactant gas enters the back plate from an external gas source 20 via a gas delivery pipeline to be mixed or uniformly distributed in the back plate, and then enters a plasma deionization region between the upper electrode and the lower electrode via the gas through-holes in the gas distribution plate. In order to distribute and deliver the reactant gas into the gas distribution plate 100, a plurality of gas through-holes configured for uniformly distributing the reactant gas delivered from the back plate are arranged in the gas distribution plate 100. As the gas showerhead is generally of a disc shape, the gas through-holes and the thermal conduction layers are also usually configured into an annular shape. In order to guarantee a reliable thermal contact between the back plate and the gas distribution plate, the surface area of the thermal conduction layers should be as large as possible. As the gas inlets of the gas through-holes can only be arranged at side edges of the thermal conduction layers and in order to guarantee a uniform distribution of the gas through-holes in the gas distribution plate, the annular gas through-holes and the annular thermal conduction layers are generally arranged alternately.

In the gas showerhead shown in FIG. 4, the face of the gas distribution plate 100 adjacent to the back plate 15 is the gas inlet face 101, and the opposite side is the gas outlet face 102. The gas through-holes 110 are arranged obliquely inside the gas distribution plate. Considering that the conventional substrates are all of a round shape, in order for uniform processing to the substrate, the gas distribution plate in the present disclosure is configured as a disc shape with a center; further, it is assumed that there exists a central axis passing through the center and perpendicular to the gas distribution plate. The gas distribution plate includes a plurality of annular gas distribution regions with the center of the gas distribution plate as the center; and each annular gas distribution region is provided with a plurality of gas through-holes through the gas inlet face and the gas outlet face, the gas through-holes at least including a plurality of first gas through-holes radially inclined at a certain angle, the gas through-holes further including a plurality of second gas through-holes, the second gas through-holes being parallel to the central axis or having a radial inclination direction different from the first gas through-holes. In the embodiment shown in FIG. 4, the gas outlet direction of the plurality of first gas through-holes is inclined towards a direction of the central axis, and the gas outlet direction of the plurality of second gas through-holes is inclined away from the direction of the central axis, thereby guaranteeing that in the same annular gas distribution region, the gas flowing out of the plurality of first gas through-holes and the gas flowing out of the plurality of second gas through-holes are kept away from each other, without convergence. Hereinafter, the structural design of the present disclosure will be illustrated in detail.

Figure 5A:
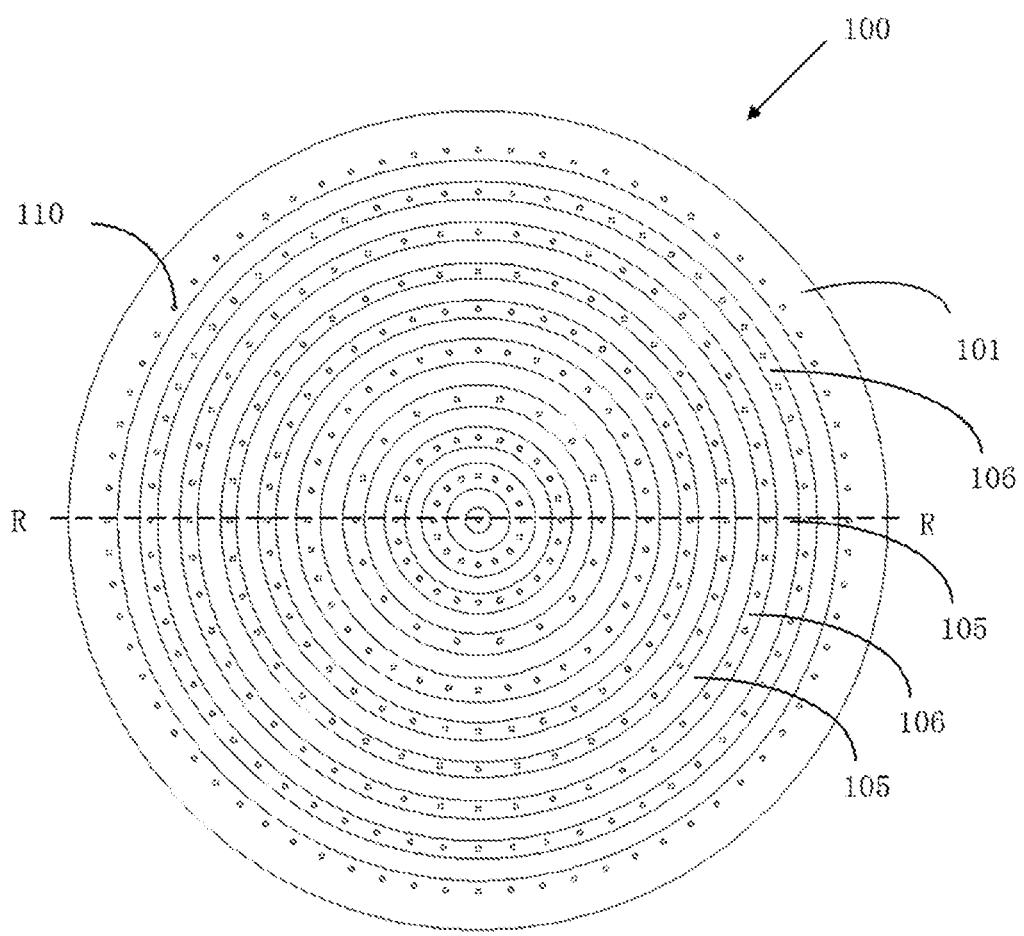
FIG. 5A~5D are structural schematic diagrams of a gas distribution plate according to an embodiment of the present disclosure.
Figure 5B:
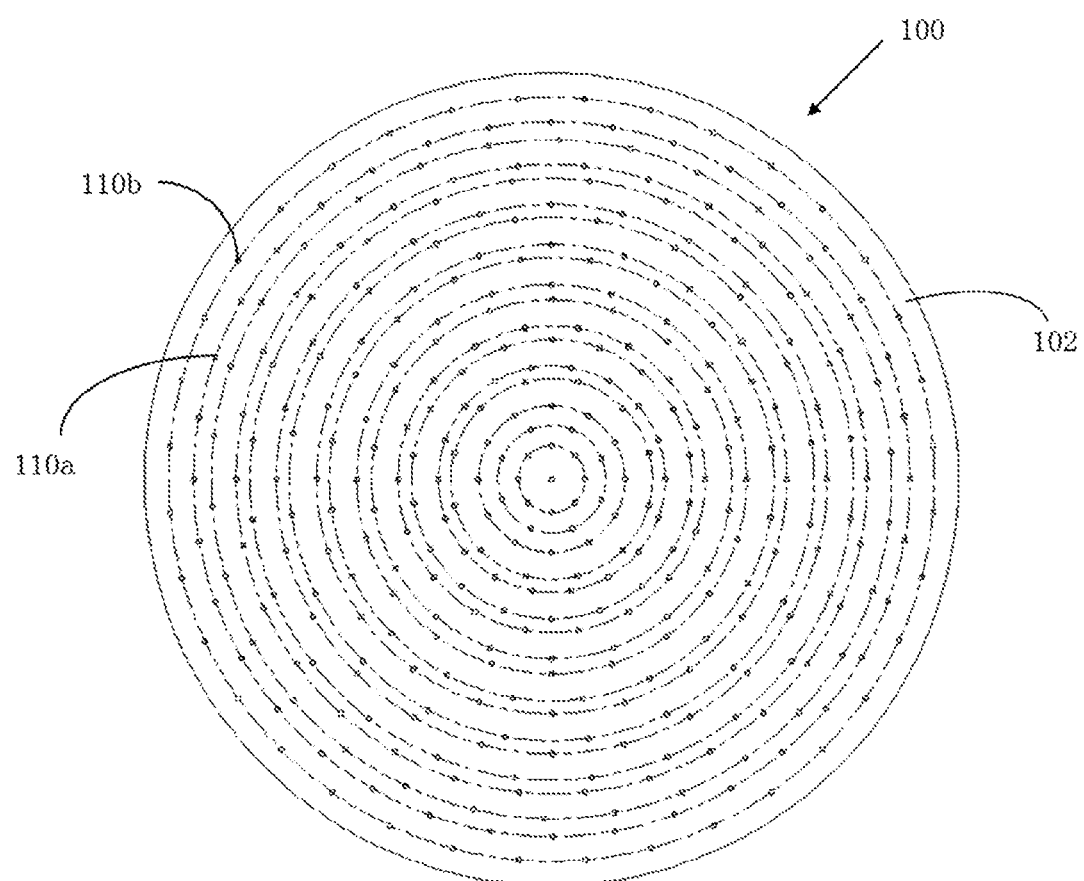
Figure 5C:
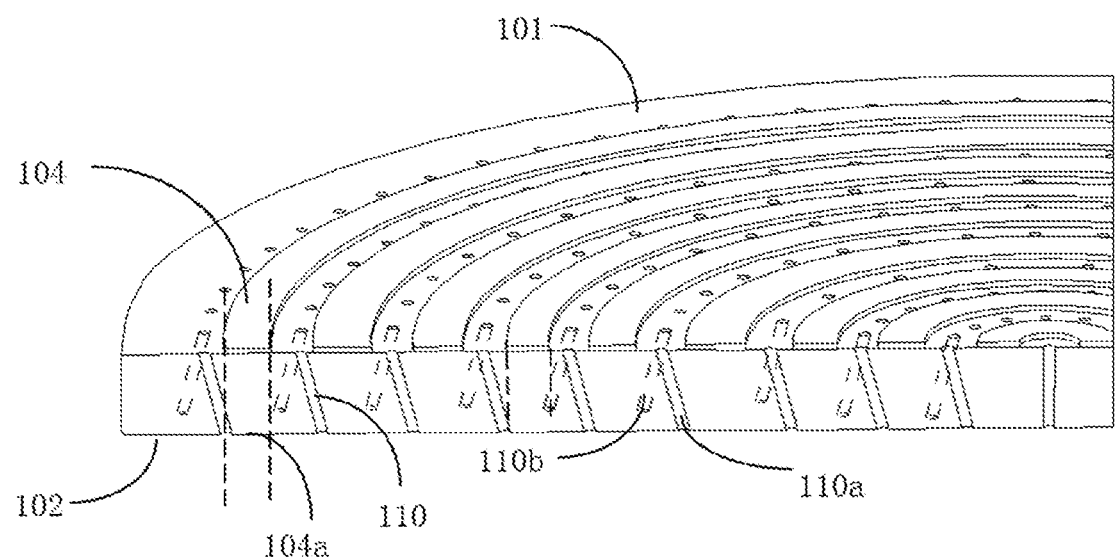
Figure 5D:
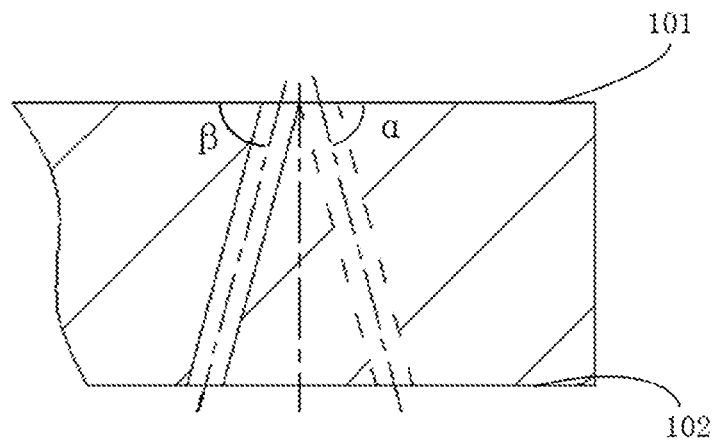

FIGS. 5A-5D illustrate a structural schematic diagram of an exemplary gas distribution plate, wherein FIG. 5A is a view of the gas inlet face of the gas distribution plate, FIG. 5B is a view of the gas outlet face of the gas distribution plate, and FIG. 5C is a sectional view of the gas distribution plate along R-R. FIG. 5D is a schematic diagram of inclination angles of the first gas through-holes and the second gas through-holes in a same gas distribution region. In the embodiments shown in FIGS. 5A-5D, a plurality of annular gas distribution regions 106 are arranged in the gas distribution plate 100, and a plurality of gas through-holes 110 penetrating through the gas inlet face 101 and the gas outlet face 102 are provided in each annular gas distribution region. To facilitate processing and manufacturing, the gas through-holes take the center of the gas distribution plate as their own center and are arranged on the gas distribution plate circle by circle according to different diameters. In this embodiment, one circle of gas through-holes is arranged in each annular gas distribution region. An annular isolation region 105 is arranged between two neighboring annular gas distribution regions 105, wherein no gas through-holes are distributed in the annular isolation region. In this embodiment, the annular gas distribution region 106 and the annular isolation region 105 are distributed alternately in the radial direction.

In order to cooperate with the design of gas through-holes and meanwhile guarantee a heat transfer effect, a thermal conduction layer 104 is arranged on the upper surface of the annular isolation region 105, where the thermal conduction layer 104 is also of an annular structure distributed between adjacent two neighboring circles of gas through-holes.

It may be seen from FIG. 5C that the gas through-holes are obliquely arranged inside the gas distribution plate; in a same annular gas distribution region, the gas through-holes include a plurality of first gas through-holes 110a having a first inclination angle and a plurality of second gas through-holes 110b having a second inclination angle. As shown in FIG. 5A, a radial width of the annular isolation region 105 is greater than the radial width of the annular gas distribution region 106. In this embodiment, only one circle of gas through-holes are provided in each annular gas distribution region 106, i.e., in the same gas distribution region, the distance from the opening center of respective first gas through-hole 110a in the gas inlet face to the central axis is identical to the distance from the opening center of respective second gas through-hole 110b in the gas inlet face 101 to the central axis, wherein the first gas through-holes 110a and the second gas through-holes 110b are arranged alternately. Two groups of gas through-holes have different radial inclination directions. Specifically, the gas through-holes 110a are inclined at a certain angle towards the central axis such that the gas outlet direction of the gas passing through the gas through-holes 110a is proximal to the central axis; and the gas through-holes 110b are inclined at a certain angle in a direction away from the central axis such that the gas outlet direction of the gas passing through the gas through-holes 110b extends towards a direction away from the central axis. The gas flowing out of the first gas through-holes and the gas flowing out of the second gas through-holes in same annular gas distribution region are kept away from each other, without convergence. In another embodiment, the first gas through-holes and the second gas through-holes do not strictly follow the rule of alternate arrangement. For example, a plurality of neighboring first gas through-holes form a first gas unit, and a plurality of neighboring second gas through-holes form a second gas unit, the first gas unit and the second gas unit being arranged alternately. The inclination angle of the gas through-holes 110a may be identical to or different from that of the gas through-holes 110b, wherein the first inclination angle α of the first gas through-holes refers to the included angle between the gas through-holes 110a and the gas inlet face 101, which ranges from 60° to 90°. Likewise, the second inclination angle β of the second gas through-holes refers to the included angle between the gas through-holes 110b and the gas inlet face 101, which ranges from 60° to 90°, as shown in FIG. 5D. For the sake of description, in this embodiment, the gas through-holes 110a and the gas through-holes b preferably have the same inclination angle but different inclination directions.

As shown in FIG. 5B, as the first gas-through holes 110a are inclined at a same angle toward the direction of the central axis in this embodiment, the gas outlets of the first gas through-holes 110a have a same radial distance in the gas outlet face. Likewise, as the second gas through-holes 110 are inclined at a same angle away from the direction of the central axis, the second gas through-holes 110b also have the same radial distance in the gas outlet face. It may be seen from the comparison between FIG. 5A and FIG. 5B that one circle of gas through-holes with the same radial distance in the gas inlet face 101 turns into two circles of gas through-holes in the gas outlet face 102 such that compared with the distance between two neighboring gas inlets with the same radial distance in the gas through-hole circle in the gas inlet face, the distance between two neighboring gas outlets in a same gas through-hole circle in the gas outlet face increases; meanwhile, compared with the radial difference between two circles of gas through-holes in two neighboring annular gas distribution regions in the gas inlet face, the radial difference between two circles of gas through-holes in the gas outlet face decreases such that the openings of the gas through-holes in the gas outlet face are distributed more uniformly. Compared with the prior art, although the amount of openings of the gas through-holes in the gas inlet face is doubled, the distance between two neighboring gas through-holes in the same annular gas distribution region in the gas outlet face does not decrease because in the present disclosure, the gas through-holes are ingenuously designed to incline at a certain angle, such that a gas curtain due to a too small distance between neighboring gas through-holes is not formed at the gas outlets of the same circle of gas through-holes.

In another embodiment, the inclination angles of gas through-holes may be set different. Any setting is deemed as complying with the inventive purpose of the present disclosure as long as the gas outlets are uniformly distributed on the gas outlet face and meanwhile the gas inlets in the gas inlet face does not affect setting of the thermal conduction layers.

Figure 5E:
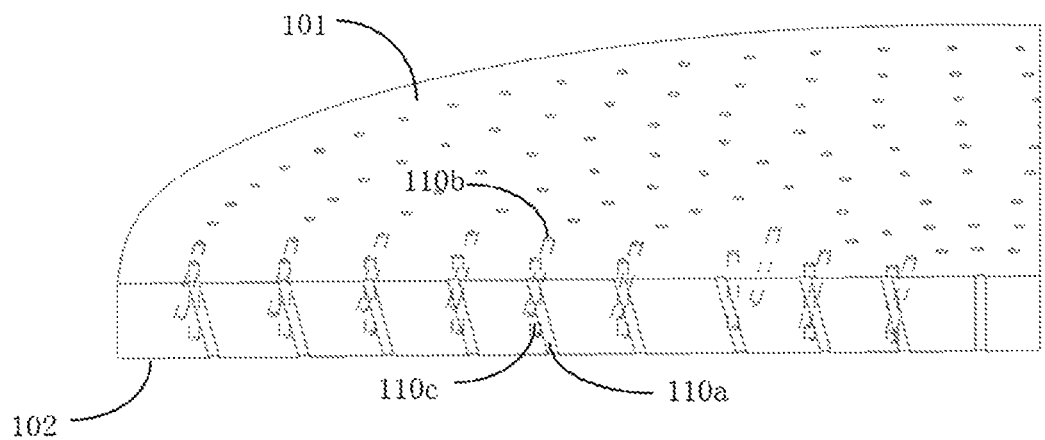
FIG. 5E is a structural schematic diagram of a gas distribution plate of the present disclosure.

In the embodiments of the present disclosure, the first gas through-holes and the second gas through-holes in the same annular gas distribution region may be simultaneously set with an included angle ranging in [60°, 90°] relative to the gas inlet face; or, a group of gas through-holes may be set with a certain inclination angle, and another group of gas through-holes is set to parallel with the central axis in a vertical direction. Or, in the embodiment shown in FIG. 5E, a third group of gas through-holes 110c is set, wherein a third inclination angle exists between the third group of gas through-holes and the gas inlet face; preferably, the third inclination angle is smaller than the first inclination angle and the second inclination angle; in this embodiment, the third inclination angle is set to 90°, parallel to the central axis in the vertical direction. In this embodiment, the first gas through-holes, the second gas through-holes, and the third gas through-holes are arranged alternately, such that the gas through-holes in the same annular gas distribution region form three circles of gas outlets in the gas outlet face, thereby improving distribution uniformity of the gas through-holes in the gas outlet face. Because the distance between the gas outlets in two neighboring annular gas distribution regions in the gas outlet face is related to the included angle between the two neighboring gas through-holes and the thickness of the gas distribution plate, when one of the two neighboring gas through-holes in a same annular gas distribution region is set with a larger inclination angle while the other is arranged perpendicular to the gas outlet face, the distance between two neighboring circles of gas outlets in the gas outlet face can also increase, avoiding formation of the gas curtain.

As shown in FIG. 5C, the openings arranged in the gas inlet face of the gas distribution plate can only be disposed on two sides of the thermal conduction layer. The thermal conduction layer 104 has an orthographic projection area 104a on the gas outlet face 102. According to the embodiments illustrated above, because the gas through-holes in the present disclosure have a certain inclination angle, at least part of the gas outlets of the gas through-holes 110 in the gas outlet face 102 are located in the projection area 104a; such arrangements in the present disclosure allow the gas outlets to bypass the restrictions of the thermal conduction layers so as to sufficiently utilize the space in the gas outlet face, which reduces the distance between outlets of two neighboring circles of gas through-holes, rendering a more uniform distribution of the gas outlets of the gas through-holes.

In this embodiment, it is set that the gas through-holes have a certain inclination angle or an included angle greater than 5° exists between two or more groups of gas through-holes in the same gas distribution region; in this way, the gas outlets in the lower surface of the gas distribution plate may become more uniform while guaranteeing no decrease of the size of the thermal conduction layers; meanwhile, this avoids the gas curtain phenomenon due to a too small distance between two neighboring gas outlets. In this embodiment, the amount of gas through-holes increases significantly such that the gas flow rate through each gas through-hole may be effectively reduced while not reducing the total amount of gas supplied in the vacuum reaction chamber, which prevents the non-deionized reactant gas from spraying onto the substrate surface, thereby improving the processing uniformity with respect to the substrate surface under the gas through-holes and other areas.

In this embodiment, the size of the thermal conduction layers should be arranged as large as possible so as to guarantee the thermal conduction effect between the gas distribution plate and the back plate; therefore, a thermal conduction layer is best arranged between two neighboring circles of gas through-holes. However, in another embodiment, two circles of gas through-holes are arranged between adjacent two circles of thermal conduction layers, for example the embodiment of the gas distribution plate 200 shown in FIGS. 6A-6C.

Figure 6A:
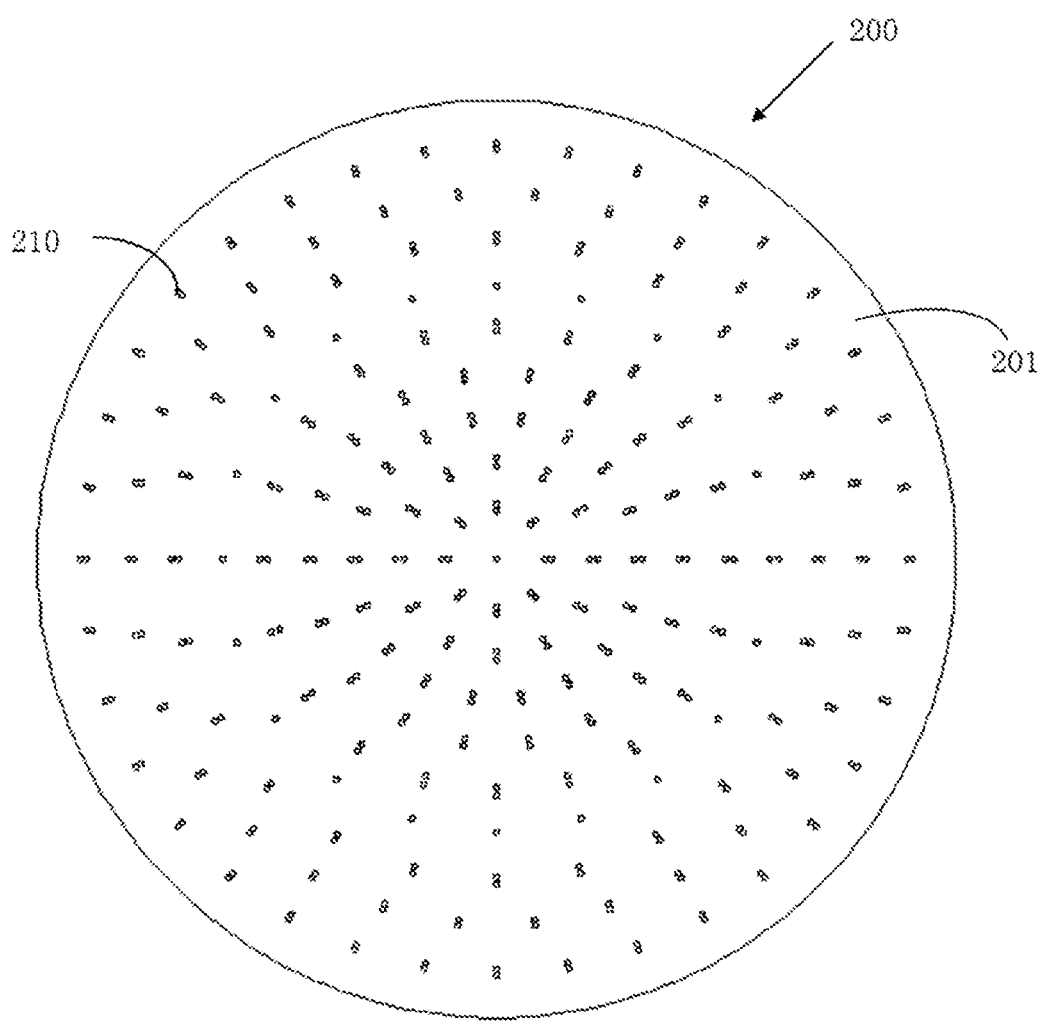
FIG. 6A~6C are structural schematic diagrams of a gas distribution plate according to an embodiment of the present disclosure.

In the structural schematic diagram of the gas inlet face of the gas distribution plate shown in FIG. 6A, in the gas inlet face of the same annular gas distribution region, there exists a distance difference greater than 0 between the radial distance from the first gas through-holes to the central axis and the radial distance from the second gas through-holes to the central axis, i.e., two circles of gas through-holes 210 are arranged in the gas inlet face of the same annular gas distribution region. The distance between the gas inlets of the two circles of gas through-holes in the gas inlet face 201 is relatively small so as to be adapted to the relatively small distance between two adjacent circles of thermal conduction layers. In the embodiment shown in FIG. 6A, in the same annular gas distribution region, the first gas through-holes and the second gas through-holes are disposed pairwise in the same radial direction and are arranged uniformly. In the cross-section view shown in FIG. 6C, the first gas through-hole 210a is inclined towards the central axis direction, such that a first inclination angle $\alpha$ exists between the first gas through-hole and the gas inlet face; the second gas through-hole 210b is inclined away from the direction of the central axis, such that a second inclination angle $\beta$ exists between the second gas through-hole and the gas inlet face; the first inclination angle $\alpha$ and the second inclination angle $\beta$ may be identical or different, where the first inclination angle $\alpha$ and the second inclination angle $\beta$ range in [60°, 90°].

Figure 6B:
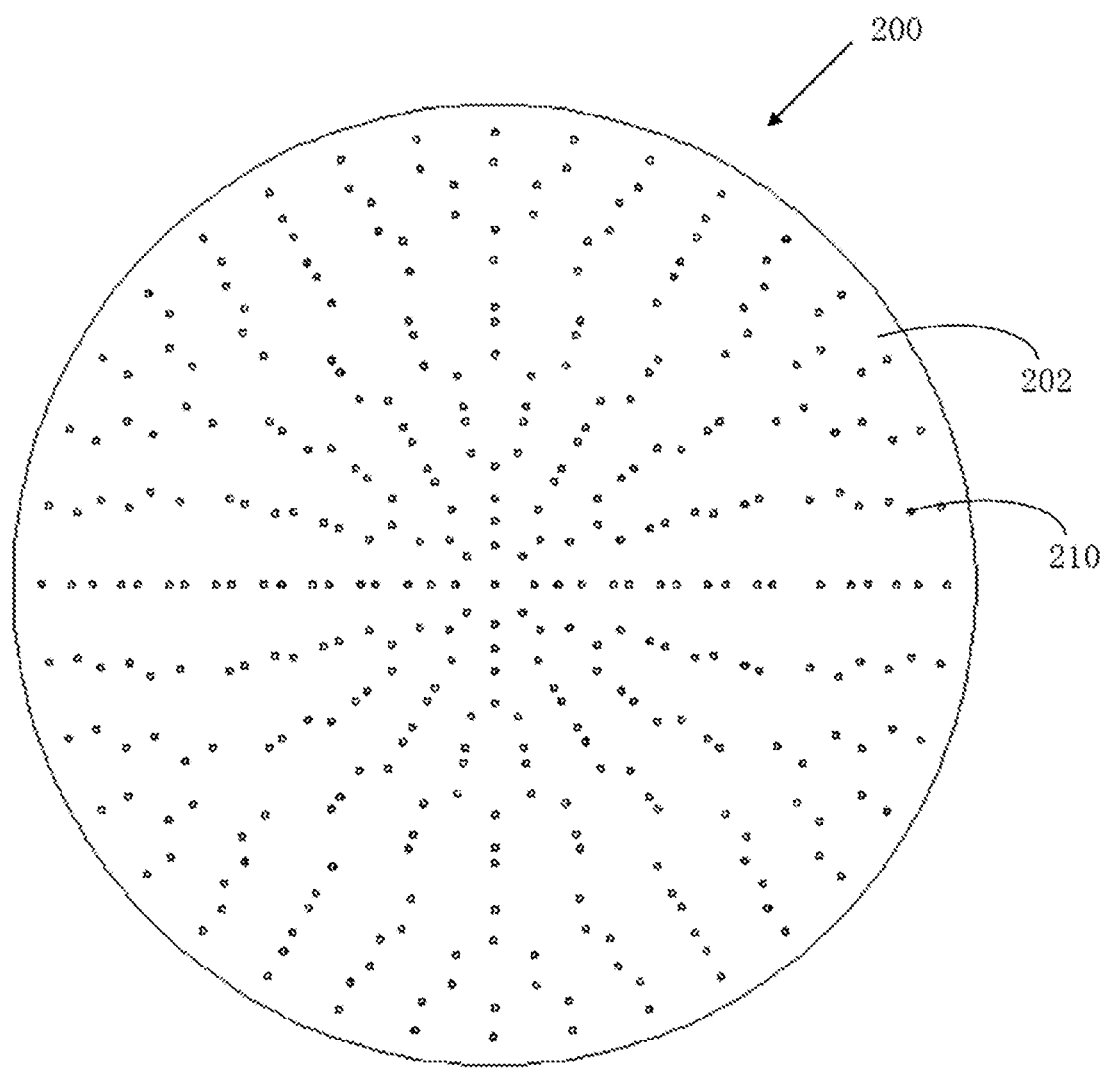
Figure 6C:
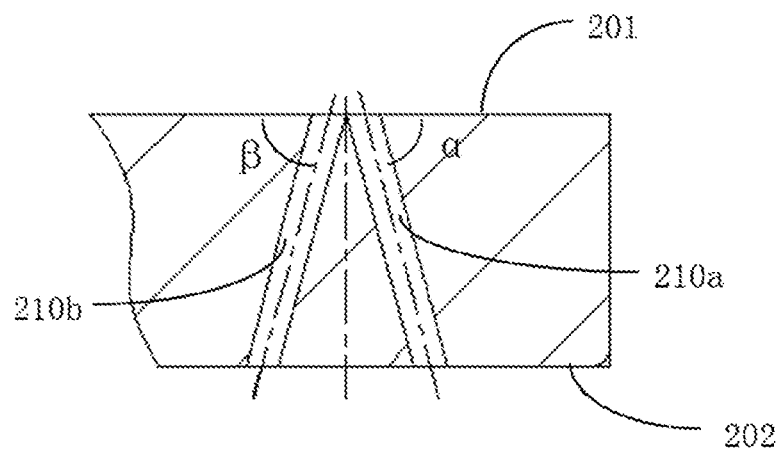

It may be seen from the structural schematic diagram of the gas outlet face 202 of the gas distribution plate shown in FIG. 6B that the distance between the gas outlets in the gas outlet face corresponding to the two closely adjacent circles of gas inlets in the gas inlet face becomes larger. Supposing that there exists a first radial distance difference between the radial distance from the opening center of the first gas through-hole in the gas inlet face to the central axis and the radial distance from the opening center of the second gas through-hole in the gas inlet face to the central axis, and that in the same gas distribution region, there exists a second radial distance difference between the radial distance from the opening center of the first gas through-hole in the gas outlet face to the central axis and the radial distance from the opening center of the second gas through-hole in the gas outlet face to the central axis, it may be seen from this embodiment of the present disclosure that the second radial distance difference is greater than the first radial distance difference. Therefore, the openings of the gas through-holes in the gas outlet face are distributed more uniformly than the openings in the inlet face, such that when the amount of gas through-holes increases, the distance between the openings of two neighboring gas through-holes with the same radial distance in the gas outlet face does not decrease, which avoids formation of the gas curtain due to excessive density of gas outlets in the same annular gas distribution region from affecting the uniformity of substrate processing.

Figure 7A:
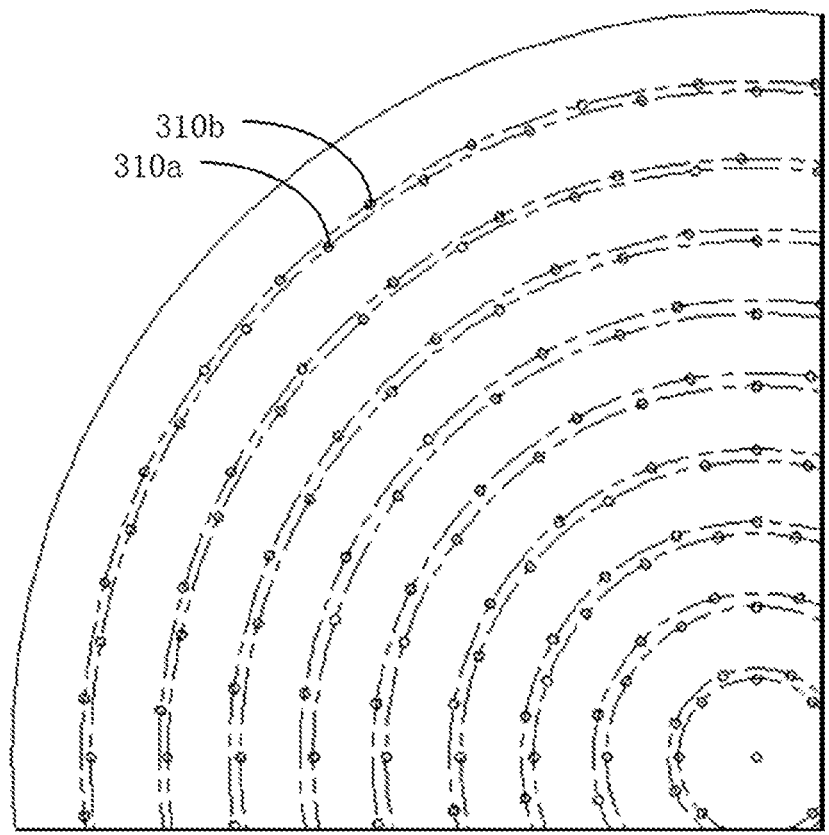
FIG. 7A~7B are structural schematic diagrams of a gas distribution plate according to an embodiment of the present disclosure.
Figure 7B:
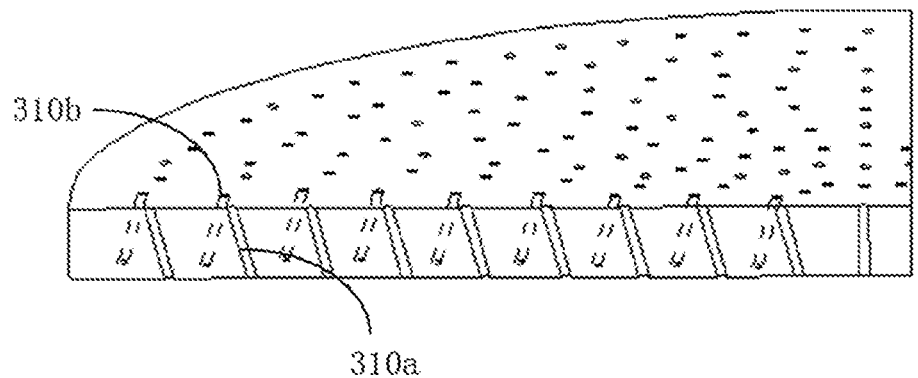

FIGS. 7A and 7B illustrate another embodiment. In this embodiment, two circles of gas through-holes are also provided within the same annular gas distribution region. Different from the preceding embodiment where the first gas through-holes and the second gas through-holes are distributed pairwise in the same radial direction, the first gas through-holes and the second gas through-holes in this embodiment are arranged in stagger with each other and located in different radial directions, wherein the gas through-holes proximal to the inner circle are inclined at a certain angle towards the central axis direction, and the second gas through-holes proximal to the outer circle are inclined at another angle away from the direction of the central axis. The two angles may be identical or different.

Reasonable arrangement of the gas through-holes in two sides of the annular thermal conduction layer guarantees distribution uniformity of the gas outlets in the gas outlet face.

In the above two embodiments, two circles of gas through-holes are arranged in the same annular gas distribution region; in other embodiments, more than two circles of gas through-holes may be arranged in the same annular gas distribution regions; due to restrictions that gas through-holes cannot be arranged on the annular isolation region between two adjacent annular gas distribution regions and the radial size of the annular isolation region is greater than the radial size of the gas through-holes, the gas through-holes in the same annular gas distribution region are arranged relatively densely; in the present disclosure, by setting the gas through-holes to have a certain inclination angle, the interval between the gas outlets of a plurality of circles of gas through-holes in the same annular gas distribution region in the gas outlet face increases, such that no gas curtain will be formed while the amount of gas through-holes increases, which guarantees that the reactant gas is uniformly supplied into the reaction chamber.

Like the embodiment shown in FIG. 5C, in the embodiments shown in FIGS. 6A-6C and 7A-7B, there also exist at least part of the gas outlets disposed in the projection area of the thermal conduction layer on the gas outlet face. This setting enables sufficient utilization of the space on the gas outlet face so as to uniformly arrange the gas outlets.

To meet the requirements of a high aspect ratio etching apparatus, the present disclosure increases the amount of gas through-holes based on the conventional gas distribution plate; by setting the gas through-holes with a certain inclination angle relative to the vertical direction, it guarantees that the amount of gas through-holes increases without creating a gas curtain or other issues which would affect uniform processing of the substrate. As the amount of gas through-holes in the gas distribution plate increases, the back plate above the gas distribution plate should also be improved so as to cooperate with the gas through-holes in the gas distribution plate. One way is to synchronously increase the amount of gas through-holes in the gas distribution plate, which, however, would increase the cost, and meanwhile designing of a new back plate would also prolong the design period and increase the component management cost.

To address this problem, the present disclosure makes further improvement over the embodiments above, wherein the novel gas distribution plate may be adapted to conventional back plates with an improved gas uniformity.

Figure 8A:
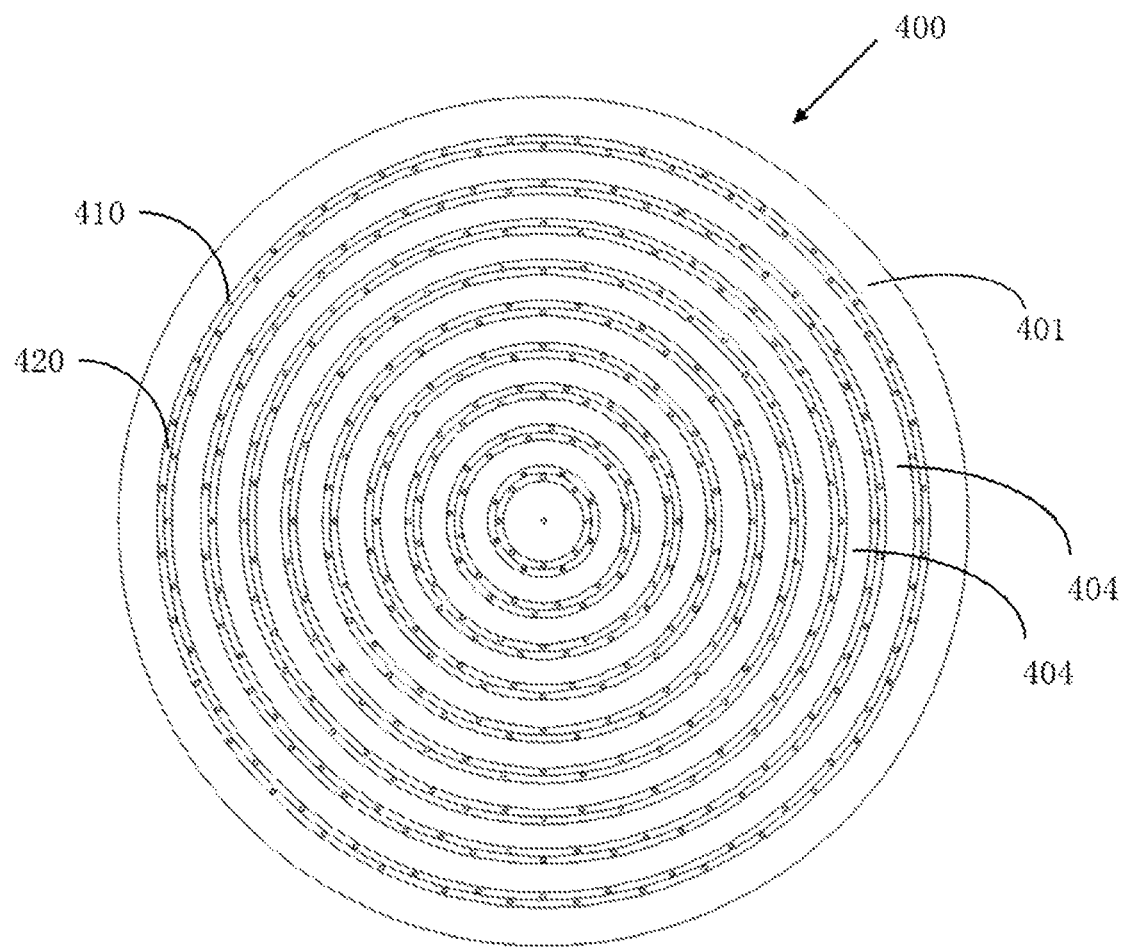
FIG. 8A~8C are structural schematic diagrams of a gas distribution plate according to an embodiment of the present disclosure.
Figure 8B:
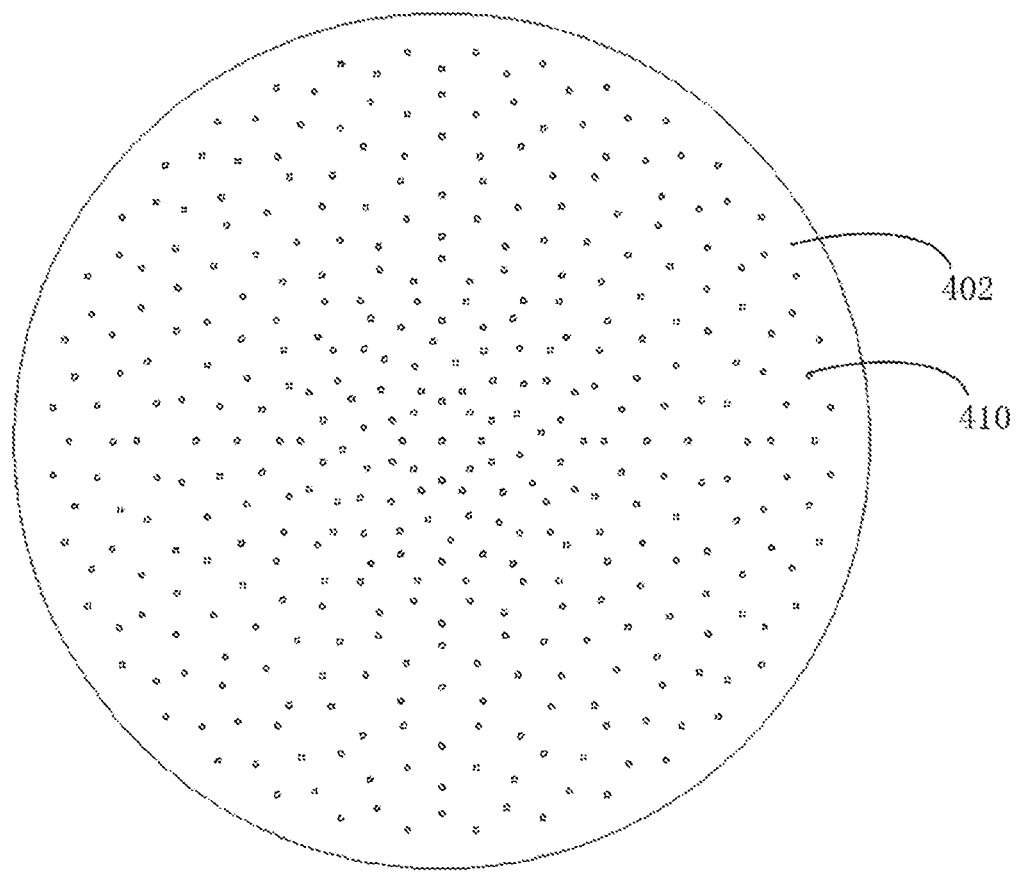
Figure 8C:
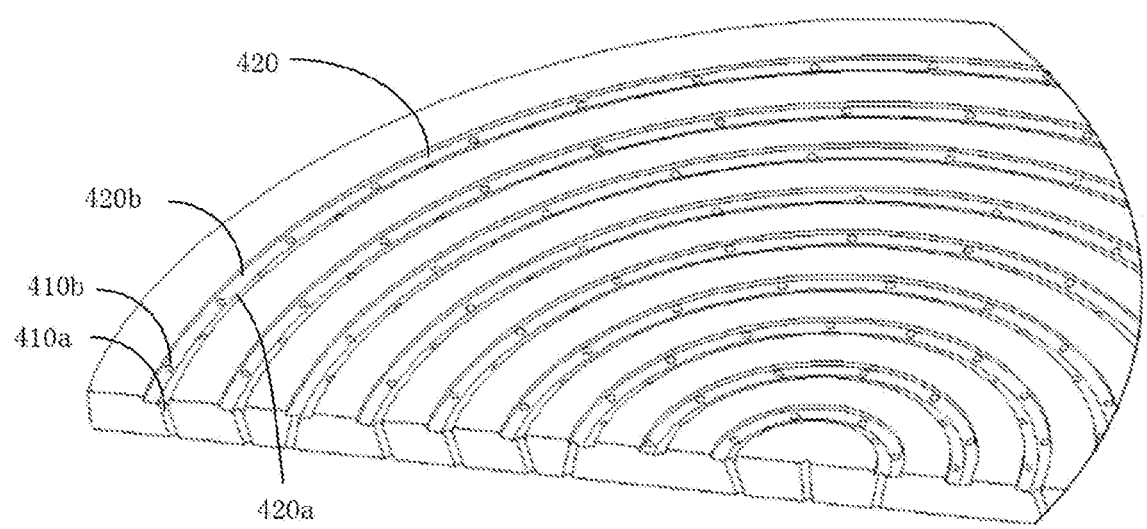

FIGS. 8A-8C illustrate a gas distribution plate 400 having a recessed groove in the gas inlet face, wherein FIG. 8A illustrates a structural schematic diagram of the gas inlet face 401 of the gas distribution plate; FIG. 8B illustrates a structural schematic diagram of the gas outlet face 402 of the gas distribution plate; and FIG. 8C illustrates a cross-section structural schematic diagram of the gas distribution plate. In FIG. 8A, a recessed groove 420 having a certain inclination angle is provided in the annular gas distribution region. To sufficiently utilize the space between thermal conduction layers, the recessed groove 420 may have one inclined bottom face or have two inclined bottom faces 420a and 420b; the two inclined bottom faces render the recessed groove to have a V shape. The inclination angles of the two inclined bottom faces may be identical or different. It may be seen from the cross-sectional view of FIG. 8C that a circle of first gas through-holes 410a and a circle of second gas through-holes 410b, which have a certain inclination angle, are separately arranged on the two beveled surfaces of the recessed groove 420. In the embodiment shown in FIG. 8C, the first gas through-holes 410a and the second gas through-holes 410b located in the same annular gas distribution region are arranged in stagger with an interval, which are located in different radial directions and are spaced with a certain interval; while in another embodiment, the first gas through-holes 410a and the second gas through-holes 410b may be arranged pairwise abreast in the gas inlet face, where each pair are located in the same radial direction, like the embodiment described by FIG. 6A.

In the embodiment described in FIGS. 8A-8C, setting of the recessed groove 420 may significantly lower the difficulty of making inclined holes. Because the gas through-holes in the gas distribution plate generally have a smaller diameter, i.e., about 1 mm, when making an inclined hole on a plane with a drill of a smaller diameter, it is very easy for the drill to be broken. However, in the present disclosure, two inclined faces 420a and 420b are arranged based on the required inclination angle and direction of the gas through-holes, which may guarantee that the drill is still perpendicular to the processed faces (i.e., inclined faces 420a and 420b) when making the inclined angles, which avoids the drill from being damaged and lowers the difficulty of making the inclined gas through-holes.

Besides, a guide groove with uniform gas distribution is further formed by the recessed groove 420 comprising the inclined faces 420a and 420b. As mentioned above, with the effort of not changing the conventional design of back plate, the reactant gas is delivered into the recessed groove 420 via the original gas channel and is uniformly diffused in the recessed groove 420, thereby forming an isobaric area. With uniform diffusion in the recessed groove 420, the reactant gas entering the reaction chamber via the first gas through-holes 410a and the second gas through-holes 410b may maintain uniformity to the maximum extent. Without changing the conventional back plate, the present disclosure realizes increase of the gas through-holes in the gas distribution plate. Setting of the recessed groove 420 in the gas inlet face guarantees uniform gas distribution; meanwhile, it may be seen from the structural schematic diagram of the gas outlet face shown in FIG. 8B that the gas outlets of the gas through-holes are distributed very uniformly in the gas outlet face. Compared with the gas inlet face, the gas outlet face is restricted by thermal conduction layers. By setting the gas through-holes to incline at a certain angle, the present disclosure sets a part of gas outlets under the thermal conduction layers so as to maximize uniform distribution of the gas outlets. As the distribution of the gas entering the vacuum reaction chamber is mainly affected by the distribution of gas outlets, the gas distribution plate provided by the present disclosure may significantly improve distribution uniformity of the reactant gas.

It is optional to set a recessed groove only formed by inclined faces on the gas inlet face of the gas distribution plate. In another embodiment, in order to reduce the height of the gas through-holes, the recessed groove may be first recessed downward by a certain distance, and then the inclined bottom face is set, thereby forming a structure similar to V, as shown in FIG. 9.

Figure 9:
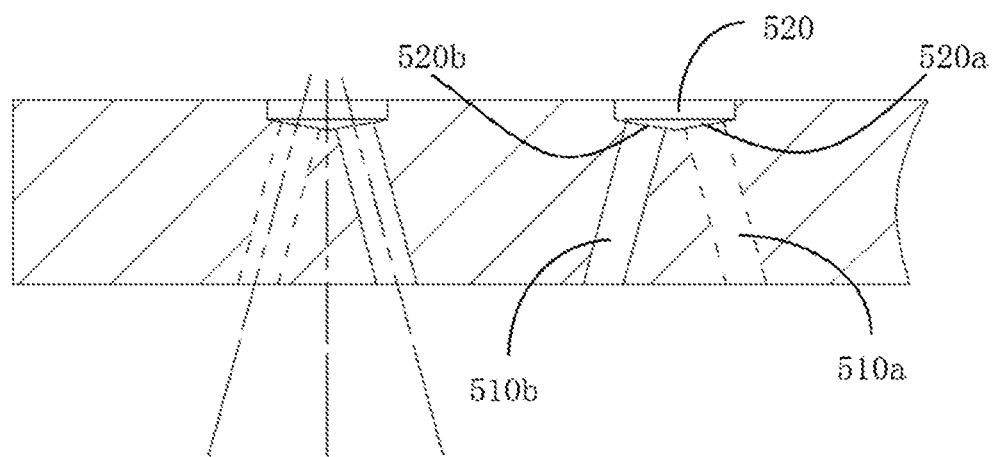
FIG. 9 is a structural schematic diagram of a gas distribution plate according to an embodiment of the present disclosure.

In the sectional view of the gas distribution plate shown in FIG. 9, the recessed groove 520 is first recessed downwardly by a certain distance perpendicular to the gas inlet face and then two inclined faces 520a and 520b are made; first gas through-holes 510a inclined towards the central axis and second gas through-holes 510b inclined away from a direction of the central axis are separately provided in the two inclined faces 520a and 520b. Because it is relatively difficult to make small-aperture high-depth holes, the embodiments of the present disclosure may shorten the depth of the gas through-holes, thereby lowering the difficulty and cost of making gas through-holes.

Figure 10:
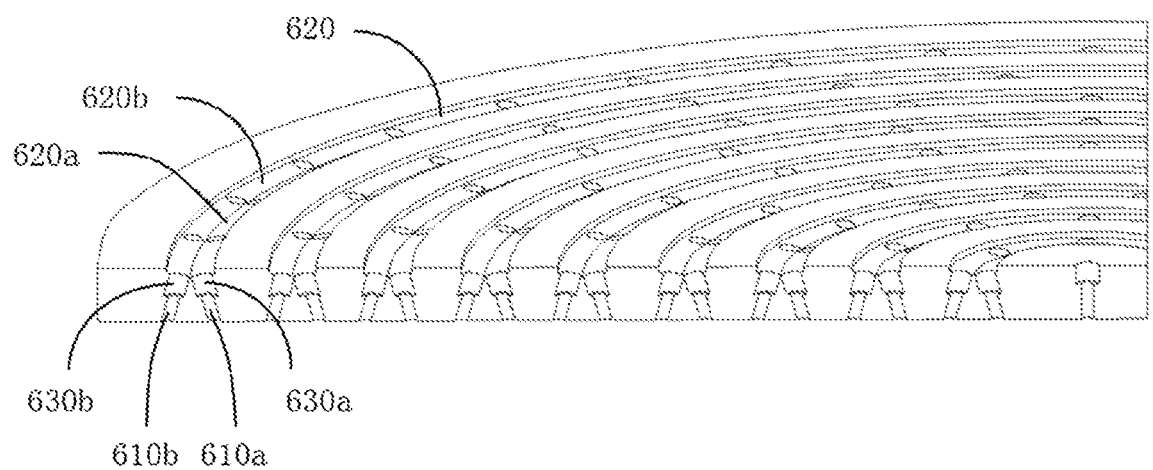
FIG. 10 is a structural schematic diagram of a gas distribution plate according to an embodiment of the present disclosure.

FIG. 10 illustrates a cross-sectional view of the gas distribution plate according to another embodiment. In the embodiment illustrated in FIG. 10, a gas groove 620 is likewise provided, wherein the gas groove has two inclined bottom faces 620a and 620b; in order to further shorten the depth of elongated-diameter gas through-holes, the present disclosure further makes sink holes 630a and 630b with a relatively large diameter in the inclined bottom face, and then make gas through-holes with a smaller aperture at the bottom of the sink holes 630a and 630b. To facilitate making, the sink holes 630a and 630b in this embodiment are also small holes with a certain inclination angle. The bottom face of the sink holes 630a and 630b also needs to set a certain inclination angle so as to facilitate making of the first gas through-holes 610a and the second gas through-holes 610b. In this embodiment, the height of the gas through-hole in the gas distribution plate is the sum of the height of the gas groove, the height of the sink hole, and the height of the small-aperture gas through-hole; because the difficulty of making the recessed grooves and sink holes is relatively low and the height of the small-aperture gas through-hole is relatively low, the difficulty of making the gas through-holes in the gas distribution plate is significantly reduced. Meanwhile, design of the gas groove may well improve the gas uniformity of the gas through-holes in the same recessed groove in the gas outlet face, which in turn improves uniformity of substrate processing.

In the embodiment shown in FIG. 10, the sink holes and gas through-holes in different inclined faces within the same recessed groove may be pairwise located in the same radial direction, which may be disposed pairwise abreast, or disposed separately in different radial directions and mutually staggered with a certain distance.

Figure 11:
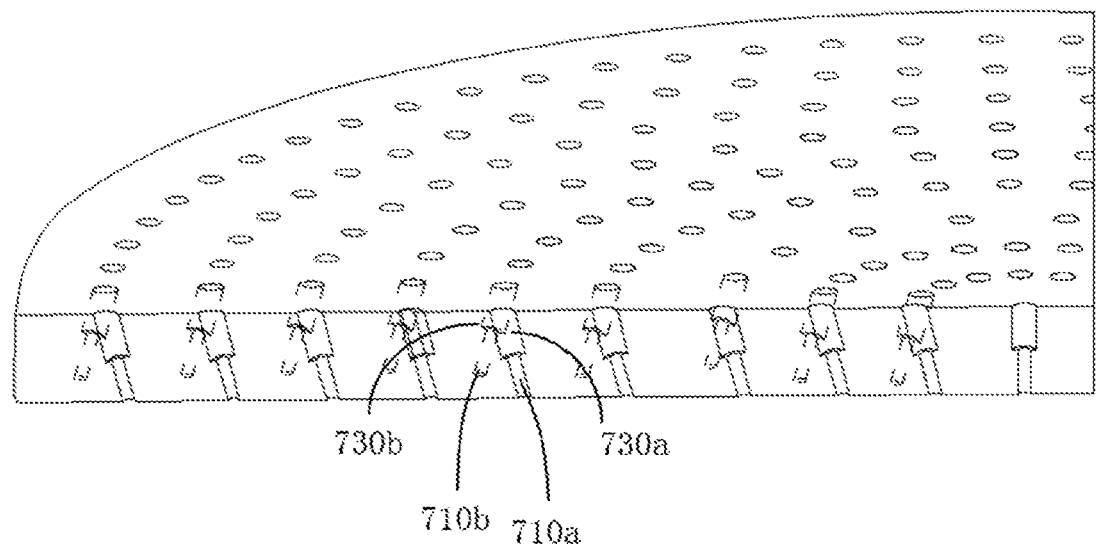
FIG. 11 is a structural schematic diagram of a gas distribution plate according to an embodiment of the present disclosure.

In the embodiment shown in FIG. 11, in order to lower the difficulty of making the gas through-holes, sink holes with a relatively large aperture may be first made in the gas inlet face. The sink holes may be set as first gas sink hole 730a and second gas sink hole 730b with a certain inclination angle; then, small-aperture first gas through-holes 710a and second gas through-holes 710b are set on the inclined bottom face of the sinks. Because the difficulty of making large-aperture sink holes is lower than making small-aperture gas through-holes, the difficulty of making the gas through-holes in the gas distribution plate is significantly lowered.

When processing the gas through-holes on the gas distribution plate, the larger the inclination angle, the greater the processing difficulty is; therefore, in order to reduce the inclination angle, when two or more circles of gas through-holes are arranged within the same annular gas distribution region, the circle of gas through-holes proximal to the central axis are arranged to incline towards the central axis direction, and the circle of gas through-holes distant from the central axis are arranged to incline towards a direction away from the central axis. In another embodiment, other settings may be made on the same gas distribution plate according to needs. For example, in the edge area of the gas distribution plate, it may be set that the gas through-holes in the annular gas distribution region in the edge area are all inclined towards the central axis, wherein the inclination angles may be identical or different.

In the plurality of embodiments described in the present disclosure, to facilitate comparison between the gas through-hole distribution on the gas inlet face and that on the gas outlet face, it is assumed that the gas through-holes all have a same inclination angle. In practice, because distribution of the reactant gas between the upper electrode and the lower electrode is largely related to the distribution of the gas through-holes in the gas outlet face, the inclination angles of the gas through-holes in the gas distribution plate need to be set based on actual needs, which may be set identical or different.

In the plurality of embodiments described by the present disclosure, to facilitate comparison between the gas through-hole distribution on the gas inlet face and that on the gas outlet face, it is assumed that the inclination directions of the gas through-holes are set towards the circle center direction or away from the circle center direction. In practice, because distribution of the reactant gas between the upper electrode and the lower electrode is largely related to the distribution of the gas through-holes in the gas outlet face, the inclination directions of the gas through-holes in the gas distribution plate need to be set based on actual needs, which may be set to any required direction.

An output power of the radio frequency bias power applied to the plasma apparatus according to the present disclosure is greater than or equal to 10 kW so as to implement processing of a substrate with 100 layers of etching target layers or above. The aspect ratio of the substrate etched by the present disclosure is greater than or equal to 40:1. In the present disclosure, an output frequency of the radio frequency bias power source selected in the present disclosure is greater than or equal to 100 Khz but lower than or equal to 2 Mhz.

In some embodiments, the radio frequency bias power source 74 outputs a pulse radio frequency bias signal.

Figure 12:
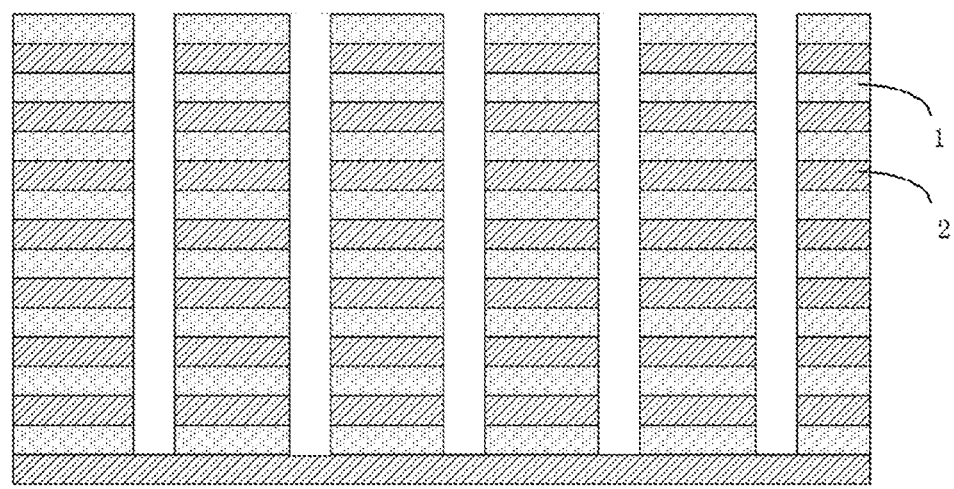
FIG. 12 is a morphological diagram of a result of substrate etching according to the present disclosure.

FIG. 12 shows a substrate processed by the plasma apparatus according to the present disclosure. It is seen from the figure that by setting inclined gas through-holes, not only the gas through-hole density on the gas distribution plate is improved, the gas flow rate through the gas through-holes is also reduced, which avoids the non-uniformity of the etching in different regions caused by directly spraying the gas through the through-holes in the substrate; the substrate fabricated using the gas showerhead of the present disclosure may achieve high aspect ratio deep holes or grooves with a good morphology, thereby meeting the requirements of high-precision memory substrates.

Although the contents of the present disclosure have been described in detail through the foregoing preferred embodiments, it should be understood that the depictions above shall not be regarded as limitations to the present disclosure. After those skilled in the art having read the contents above, many modifications and substitutions to the present disclosure are all obvious. Therefore, the protection scope of the present disclosure should be limited by the appended claims.

The invention claimed is:

1. A gas showerhead for a plasma apparatus, comprising: a gas distribution plate being a disc-shaped structure with a center, the gas distribution plate including a gas inlet face, a gas outlet face, and a central axis passing through the center and perpendicular to the gas distribution plate, wherein the gas distribution plate comprises a plurality of annular gas distribution regions with the center of the gas distribution plate as the center of each of the annular gas distribution regions, and a plurality of annular thermal conduction layers, each of the annular thermal conduction layers arrange between two of the annular gas distribution regions, such that the annular thermal conduction layers and the annular gas distribution regions are arranged alternatingly;

each annular gas distribution region is provided with a plurality of gas through-holes penetrating through the gas inlet face and the gas outlet face, the gas through-holes at least including a plurality of first gas through-holes radially inclined at a first inclination angle, and a plurality of second gas through-holes being parallel to the central axis or having a second inclination angle inclined radially -at a direction different from the first gas through-holes, wherein the plurality of first gas through-holes and the plurality of second gas through-holes of each of the annular gas distribution region form one circle at the gas inlet face at a first radial distance to the central axis, and form a second circle and a third circle at the gas outlet face at a second radial distance and a third radial distance to the central axis, the second radial distance smaller than the first radial distance; and in the same annular gas distribution region, gas flowing out of the first gas through-holes and gas flowing out of the second gas through-holes are kept away from each other.

2. The gas showerhead according to claim 1, wherein a first gas outlet direction of the plurality of first gas through-holes is inclined towards a direction of the central axis, and a second gas outlet direction of the plurality of second gas through-holes is inclined away from the direction of the central axis or is parallel to the direction of the central axis.

3. The gas showerhead according to claim 1, wherein a first gas outlet direction of the plurality of first gas through-holes is inclined away from a direction of the central axis, and a second gas outlet direction of the plurality of second gas through-holes is inclined towards the direction of the central axis or is parallel to the direction of the central axis.

4. The gas showerhead according to claim 1, wherein in a same annular gas distribution region, there exists a first radial distance difference between a first radial distance from the opening center of the respective first gas through-hole in the gas inlet face to the central axis and a second radial distance from the opening center of the respective second gas through-hole in the gas inlet face to the central axis; and in the same gas distribution region, there exists a second radial distance difference between a third radial distance from the opening center of the respective first gas through-hole in the gas outlet face to the central axis and a fourth radial distance from the opening center of the respective second gas through-hole in the gas outlet face to the central axis; wherein the second radial distance difference is greater than the first radial distance difference.

5. The gas showerhead according to claim 2, wherein in a same gas distribution region, a first radial distance from the opening center of the respective first gas through-hole in the gas inlet face to the central axis is identical to a second radial distance from the opening center of the respective second gas through-hole in the gas inlet face to the central axis, the first gas through-holes and the second gas through-holes being arranged alternately with intervals.

6. The gas showerhead according to claim 4, wherein in a same gas distribution region, the first radial distance from the opening center of the respective first gas through-hole in the gas inlet face to the central axis is identical to the second radial distance from the opening center of the respective second gas through-hole in the gas inlet face to the central axis, wherein a plurality of neighboring first gas through-holes form a first gas unit, and a plurality of neighboring second gas through-holes form a second gas unit, the first gas unit and the second gas unit being arranged alternately with intervals.

7. The gas showerhead according to claim 1, wherein a first gas outlet direction of the plurality of first gas through-holes is inclined towards a direction of the central axis, and a second gas outlet direction of the plurality of second gas through-holes is inclined away from the direction of the central axis; on the gas distribution plate are further provided a plurality of third gas through-holes, the third gas through-holes being parallel to the central axis, wherein the first gas through-holes, the second gas through-holes, and the third gas through-holes are arranged alternately with intervals.

8. The gas showerhead according to claim 4, wherein in a same gas distribution region, a radial distance difference between the first radial distance from the opening center of the respective first gas through-hole in the gas inlet face to the central axis and the second radial distance from the opening center of the respective second gas-through hole on the gas inlet face to the central axis is greater than 0.

9. The gas showerhead according to claim 8, wherein in a same gas distribution region, the first radial distance from the opening center of the respective first gas through-hole in the gas inlet face to the central axis is shorter than the second radial distance from the opening center of the second gas through-hole in the gas inlet face to the central axis, wherein the opening centers of the first gas through-holes in the gas inlet face and the opening centers of the second gas through-holes in the gas inlet face are disposed pairwise in a same radial direction.

10. The gas showerhead according to claim 8, wherein in a same gas distribution region, the first radial distance from the opening center of the respective first gas through-hole in the gas inlet face to the central axis is shorter than the second radial distance from the opening center of the second gas through-hole in the gas inlet face to the central axis, wherein the opening centers of the first gas through-holes and the opening centers of the second gas through-holes are respectively disposed in different radial directions.

11. The gas showerhead according to claim 1, wherein the first inclination angle and the second inclination angle are greater than or equal to 0° but lower than 30°.

12. The gas showerhead according to claim 1, wherein an angle between an inclination direction of the first gas through holes and an inclination direction of the second gas through-holes is greater than or equal to 5°.

13. The gas showerhead according to claim 1, further comprising a plurality of annular isolation regions and wherein each annular isolation region is arranged between two neighboring annular gas distribution regions, wherein the annular gas distribution regions and the annular isolation regions are distributed sequentially and alternately along the radial direction.

14. The gas showerhead according to claim 13, wherein the as measured from the central axis, a radial width of a stripe of the annular isolation region is greater than that of the gas distribution region.

15. The gas showerhead according to claim 13, wherein the gas showerhead further comprises a back plate, the back plate being disposed opposite to the gas distribution plate, wherein the plurality of thermal conduction layers are provided between the back plate and the gas distribution plate.

16. The gas showerhead according to claim 15, wherein the thermal conduction layers are disposed on an upper surface of the annular isolation region.

17. The gas showerhead according to claim 16, wherein openings of at least part of the first gas through-holes or second gas through-holes in the gas outlet face are located in respective orthographic projection regions of the thermal conduction layers on the gas outlet face of the gas distribution plate.

18. The gas showerhead according to claim 1, wherein the gas inlet face includes a plurality of recessed grooves, each of the recessed groove having an inclined bottom face, the first gas through-holes being disposed on the inclined bottom face of respective recessed grooves.

19. The gas showerhead according to claim 18, wherein the recessed groove includes a sidewall recessed along the gas inlet face towards the gas outlet face and an inclined bottom face having a certain angle relative to the sidewall.

20. The gas showerhead according to claim 18, wherein the recessed groove includes two inclined bottom faces inclined along different directions, the two inclined bottom faces forming a "V"-shaped recessed groove.

21. The gas showerhead according to claim 20, wherein the first gas through-holes and the second gas through-holes extend perpendicular to the inclined bottom face of respective recessed grooves towards the gas outlet face.

22. The gas showerhead according to claim 18, wherein a plurality of sink holes are provided in the recessed grooves, the sink holes being arranged in the inclined bottom face of respective recessed grooves, and the openings of respective gas through-holes are arranged in the inclined bottom face of respective sink holes.

23. The gas showerhead according to claim 1, wherein a plurality of sink holes are provided in the gas inlet face, each of the sink holes having an inclined bottom face, and the openings of the gas through-holes are arranged in the inclined bottom face of respective sink holes.

24. A plasma apparatus, comprising a vacuum reaction chamber, wherein in the vacuum reaction chamber are provided:
a base configured for supporting a to-be-processed substrate;
a gas showerhead disposed opposite to the base, configured for supplying a reactant gas into the vacuum reaction chamber;
a radio frequency source power configured for deionizing the reactant gas to generate plasma;
a radio frequency bias power which is applied to the base to drive charged particles in the plasma to process the substrate; wherein
the gas showerhead comprises the features according to claim 1.

25. The plasma apparatus according to claim 24, wherein the radio frequency bias power outputs a power which is greater than or equal to 10 kilowatts.

26. The plasma apparatus according to claim 24, wherein an aspect ratio for etching the substrate is equal to 40:1.

27. The plasma apparatus according to claim 24, wherein the number of target layers for etching the substrate is greater than 100.

28. The plasma apparatus according to claim 24, wherein an output frequency of the radio frequency bias power is greater than or equal to 100Khz but lower than or equal to 2 Mhz.

29. The plasma apparatus according to claim 24, wherein the radio frequency bias power outputs a pulse radio frequency bias signal.

30. The plasma apparatus according to claim 24, wherein a gas pressure within the reaction chamber is lower than or equal to 100 mTorr.

* * * * *